United States Patent [19]

Takeda et al.

[11] Patent Number: 5,166,086
[45] Date of Patent: Nov. 24, 1992

[54] THIN FILM TRANSISTOR ARRAY AND METHOD OF MANUFACTURING SAME

[75] Inventors: Mamoru Takeda, Hirakata; Ichiro Yamashita, Katano; Isamu Kitahiro, Yawata, all of Japan

[73] Assignee: Matsushita Electric Industrial Co., Ltd., Osaka, Japan

[21] Appl. No.: 833,921

[22] Filed: Feb. 12, 1992

Related U.S. Application Data

[60] Division of Ser. No. 454,990, Dec. 22, 1989, which is a division of Ser. No. 188,623, Apr. 29, 1988, Pat. No. 4,958,205, which is a continuation of Ser. No. 845,120, Mar. 27, 1986, abandoned.

[30] Foreign Application Priority Data

Mar. 29, 1985 [JP] Japan .................................. 60-63413
Mar. 29, 1985 [JP] Japan .................................. 60-63414

[51] Int. Cl.⁵ ......................................... H01L 21/336
[52] U.S. Cl. ........................................ 437/41; 437/101; 437/909
[58] Field of Search ................. 437/40, 41, 101, 229, 437/245, 909; 357/2, 4, 23.7

[56] References Cited

U.S. PATENT DOCUMENTS

| | | | |
|---|---|---|---|
| 4,386,352 | 5/1983 | Nonomura et al. | 340/784 |
| 4,601,097 | 7/1986 | Shimbo | 437/59 |
| 4,609,930 | 9/1986 | Yamazaki | 357/23.7 |
| 4,618,873 | 10/1986 | Sasano et al. | 357/23.7 |
| 4,624,737 | 11/1986 | Shimbo | 156/643 |
| 4,685,195 | 8/1987 | Szydlo et al. | 437/41 |
| 4,700,458 | 10/1987 | Suzuki et al. | 437/41 |
| 4,788,157 | 11/1988 | Nakamura | 437/46 |
| 4,821,092 | 4/1989 | Noguchi | 357/4 |
| 4,862,234 | 8/1989 | Koden | 357/23.7 |
| 4,938,567 | 7/1990 | Chartier | 350/333 |
| 4,961,629 | 10/1990 | Kato | 350/332 |

FOREIGN PATENT DOCUMENTS

| | | |
|---|---|---|
| 0090661A2 | 10/1983 | European Pat. Off. . |
| 56-88354 | 7/1981 | Japan . |
| 57-90977 | 6/1982 | Japan . |
| 58-14568 | 1/1983 | Japan . |
| 0019378 | 1/1984 | Japan .................. 437/101 |
| 59-54270 | 3/1984 | Japan . |
| 59-90959 | 5/1984 | Japan . |
| 59-113666 | 6/1984 | Japan . |
| 59-113667 | 6/1984 | Japan . |
| 59-124319 | 7/1984 | Japan . |
| 60-92663 | 5/1985 | Japan . |
| 60-182773 | 9/1985 | Japan . |
| 60-192370 | 9/1985 | Japan . |
| 60-224277 | 11/1985 | Japan . |
| 61-15363 | 1/1986 | Japan . |
| 61-32471 | 2/1986 | Japan . |
| 0128756 | 6/1988 | Japan .................. 437/101 |

OTHER PUBLICATIONS

"Application of Amorphous Silicon Field Effect Transistors in Addressable Liquid Crystal Display Panels", Snell et al., Applied Physics, 1981, pp. 357-362.

Primary Examiner—Mary Wilczewski
Attorney, Agent, or Firm—Wenderoth, Lind & Ponack

[57] ABSTRACT

A self-aligned TFT array for liquid crystal display devices and a method of manufacturing the array are disclosed. A protective insulating layer on a semiconductor layer is exactly aligned with a gate electrode. A self-alignment method is used for patterning the protective insulating layer and an impurity-doped semiconductor layer on the semiconductor layer. No lift-off process is necessary.

4 Claims, 6 Drawing Sheets

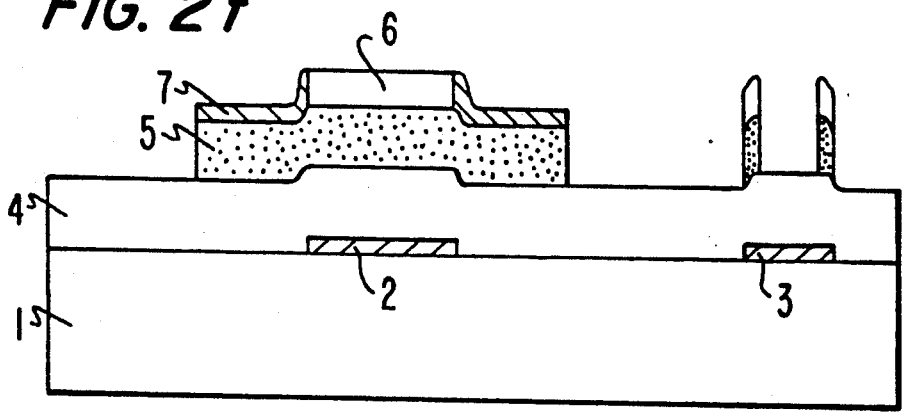
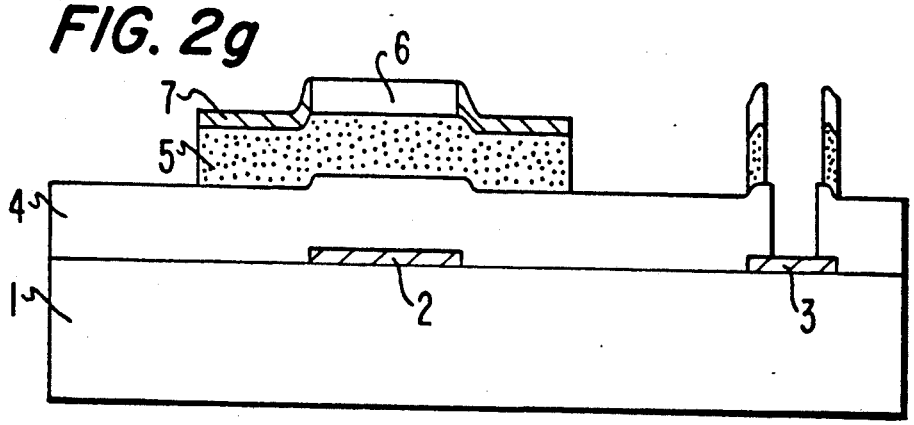
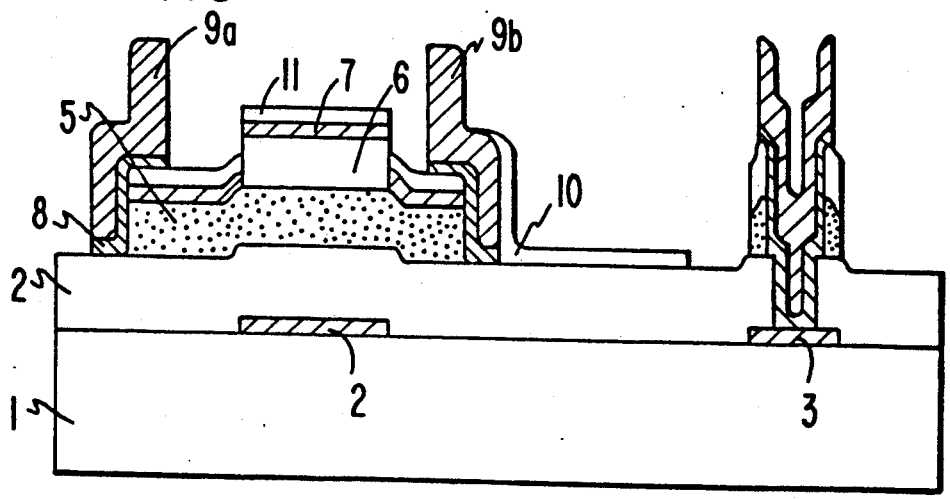

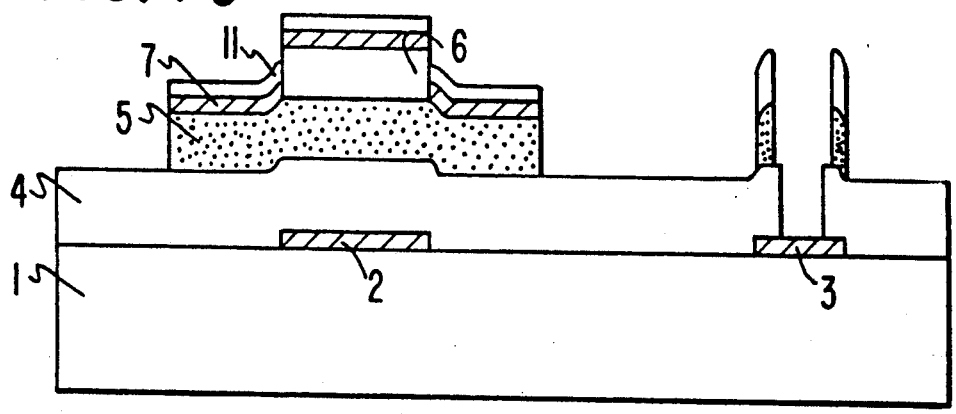
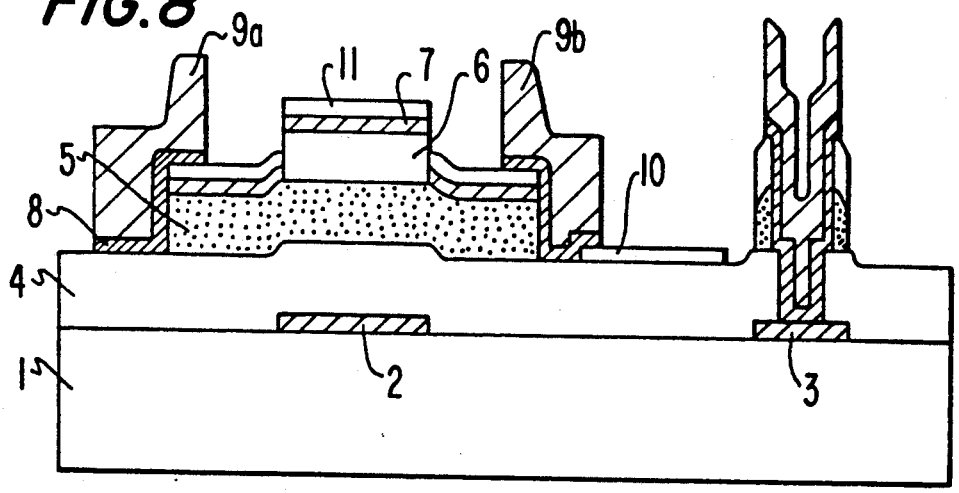
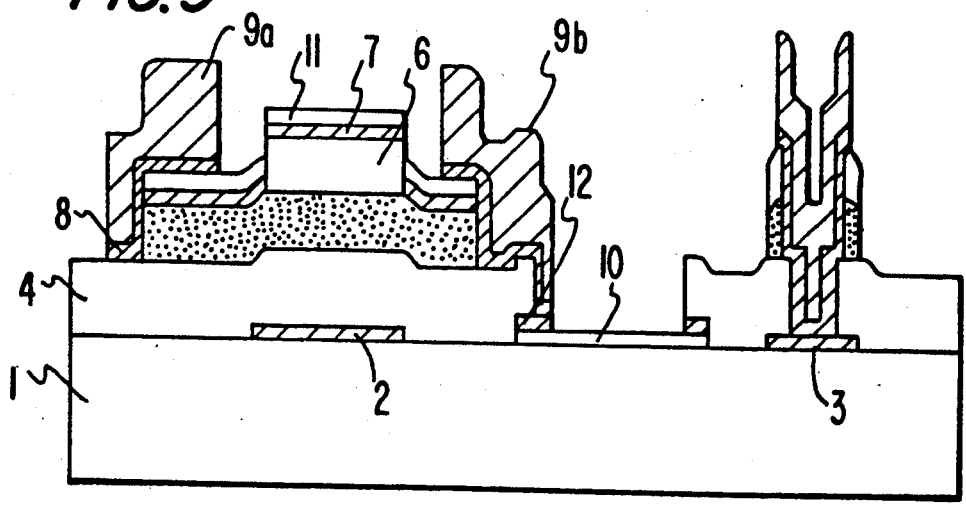

THIN FILM TRANSISTOR ARRAY AND METHOD OF MANUFACTURING SAME

This is a Divisional application of Ser. No. 07/454,990, filed Dec. 22, 1989, which in turn is a Divisional application of Ser. No. 07/188,623, filed Apr. 29, 1988, now U.S. Pat. No. 4,958,205, which is in turn a continuation application of Ser. No. 06/845,120, filed Mar. 27, 1986 now abandoned.

BACKGROUND OF THE INVENTION

1. Field of the Invention

This invention relates to a thin film transistor (TFT) array used for driving pixels in active matrix type liquid crystal display (LCD) devices and a method of manufacturing the same.

2. Description of the Prior Art

TFT arrays have recently been used in LCD devices having a large number of pixels for constituting a high contrast display.

Typical conventional methods for producing TFT arrays are disclosed in Japanese Laid-Open Patent Applications No. 58-14568 and No. 59-113667. These methods comprise a self alignment process and a lift-off process. The lift-off process is used for forming the impurity-doped semiconductor layer and the source and drain electrodes by using a resist on the protective insulating layer above the TFT channel portion. In the conventional method using the lift-off process, however, it was difficult to completely remove the resist from the insulating layer. Also, it was difficult to activate the impurity in the intrinsic semiconductor layer because of the deposition at a low temperature. The TFT array is further required to have such a structure that undesired parasitic capacitances should be as small as possible and that the channel portion should be subjected to less external light.

SUMMARY OF THE INVENTION

An object of the present invention is to provide a TFT array with reduced parasitic capacitances.

Another object of the present invention is to provide a TFT array the channel portion of which is subjected to less external light.

A further object of the present invention is to provide an easy method of producing a TFT array.

A still further object of the present invention is to produce a self-aligned TFT array without using the lift-off process.

According to the present invention, an insulative layer for protecting the channel portion and an impurity-doped semiconductor layer on the insulative layer are patterned by self-alignment by using a gate electrode pattern as a photomask. A metal layer may also be formed on the impurity-doped semiconductor layer and is also patterned by self-alignment along with the insulative layer and the impurity-doped semiconductor layer.

The above and other objects and features of the present invention will be apparent from the following description taken in connection with the accompanying drawings in which:

BRIEF DESCRIPTION OF THE DRAWINGS

FIGS. 2a, 2b, 2c, 2d, 2e, 2f and 2g are partial sectional views showing a manufacturing process of the TFT array in FIG. 1;

FIGS. 7a, 7b and 7c are partial sectional views showing a manufacturing process of the TFT array in FIG. 6; and FIGS. 8, 9 and 10 are partial sectional views showing other embodiments of self-aligned TFT arrays each having a pixel electrode according to the present invention.

DESCRIPTION OF THE PREFERRED EMBODIMENTS

Figure 1:
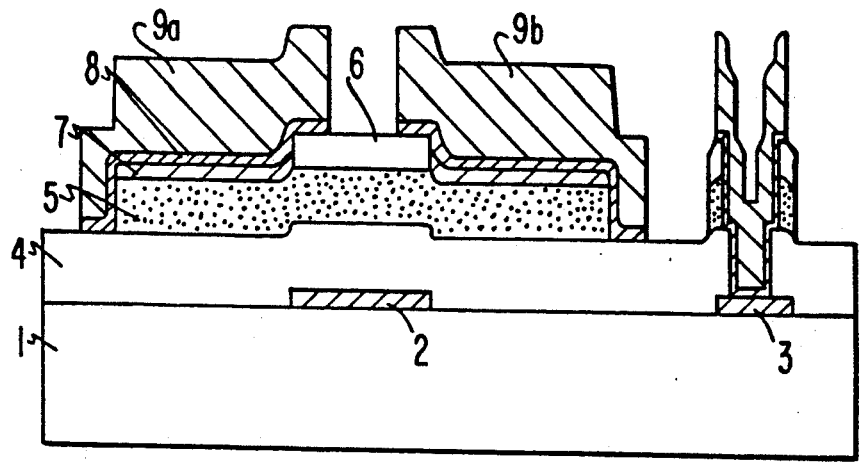
FIG. 1 is a partial sectional view showing an embodiment of a self-aligned TFT array according to the present invention.

Referring to FIG. 1, reference numeral 1 denotes a transparent insulating substrate; 2 a gate electrode formed on the substrate 1; 3 a gate electrode taking-out terminal (gate terminal) formed on the substrate 1; 4 a gate insulating layer formed on the substrate 1, gate electrode 2 and the gate terminal 3; 5 a semiconductor layer formed on the gate insulating layer 4; 6 a protective insulating layer formed on the semiconductor layer 5 above the TFT channel portion; 7 an impurity-doped semiconductor layer formed on the semicondutor layer 5; 8 a barrier metal layer formed to cover the semiconductor layers 5, 7, a part of the protective insulating layer 6 and a part of the gate insulating layer 4; 9a and 9b are source and drain electrodes, respectively, formed on the metal layer 8. The semiconductor layer 5 may be an amorphous silicon (a-Si) layer formed by plasma CVD. The impurity-doped semiconductor layer 7 may be a PH$_3$-doped a-Si (n$^+$: a-Si) layer. Each of the insulating layers 4 and 6 may be a silicon nitride (SiNx) layer formed by plasma CVD. The protective insulating layer 6 is provided for protecting the TFT channel portion. The source and drain electrodes 9a and 9b are usually made of aluminum (Al) or Al alloy. The barrier metal layer 8 may be made of titanium (Ti), tungsten (W) or chromium (Cr) and is provided for preventing the material of the source and drain electrodes from diffusing into the semiconductor layers.

The pattern of the protective insulating layer 6 is aligned with pattern of the gate electrode 2, and the impurity-doped semiconductor layer 7 is aligned with the portion which does not include the gate electrode 2.

The TFT array in FIG. 1 is manufactured by the following manufacturing process:

Step 1

Figure 2A:
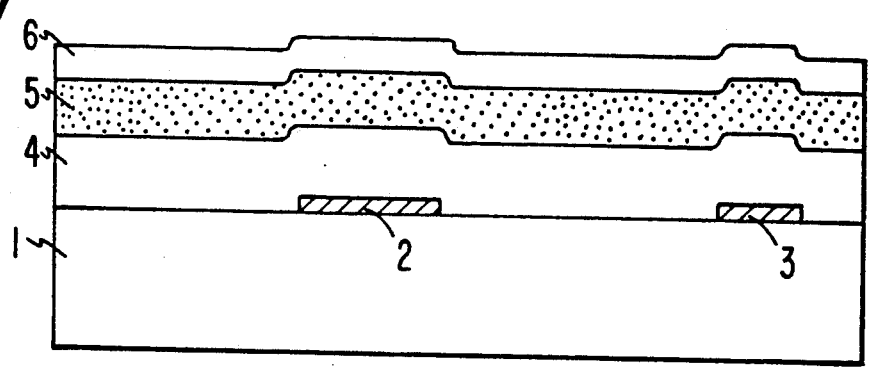

Forming the gate insulating layer 4, semiconductor layer 5 and protective insulating layer 6 in turn on the insulating substrate 1 provided thereon with the gate electrode 2 each by plasma CVD as shown in FIG. 2a.

Step 2

Figure 2B:
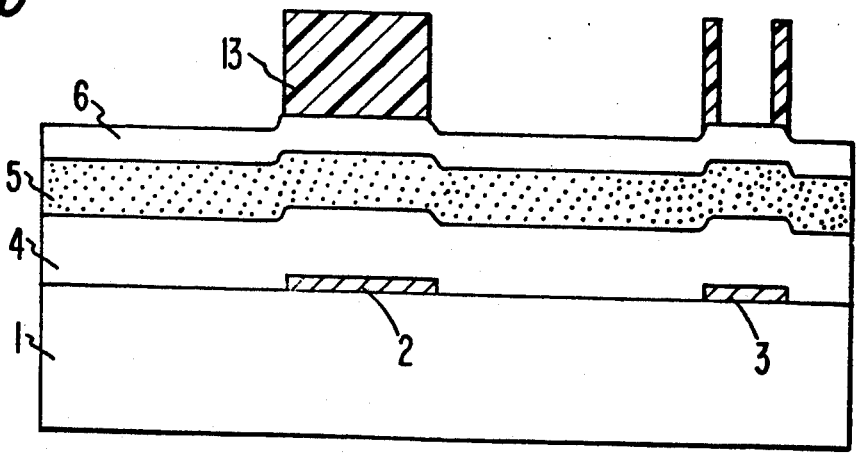
Figure 2C:
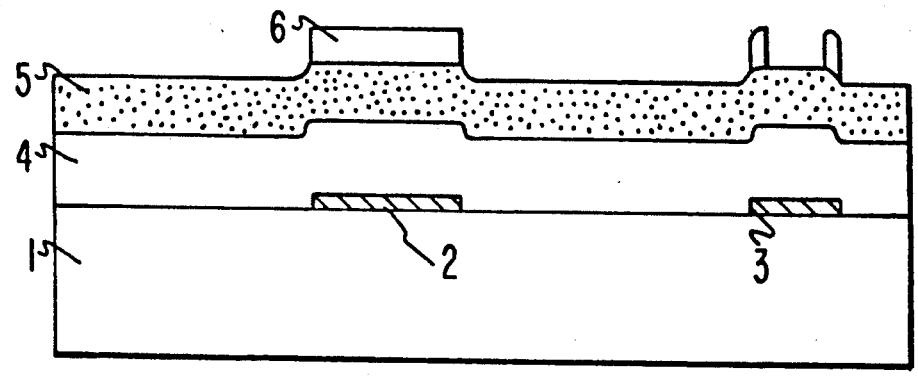

Coating the protective insulating layer 6 with a positive resist film 13, and exposing the resist film 13 to light radiating from the lower side (the substrate 1 end) so as to use the gate electrode 2 as a photomask. The portion of the resist film 13 above the gate terminal 3 is exposed by a conventional photomask. Then, the resist film 13 is developed to form a pattern as shown in FIG. 2b in which the portion of the resist film 13 above the gate electrode 2 exactly coincides with and overlies the pattern of the gate electrodes 2. Thereafter, the protective insulating layer 6 is etched by using the patterned resist film 13 as a mask, and then the resist film 13 is removed as shown in FIG. 2c.

Step 3

Figure 2D:
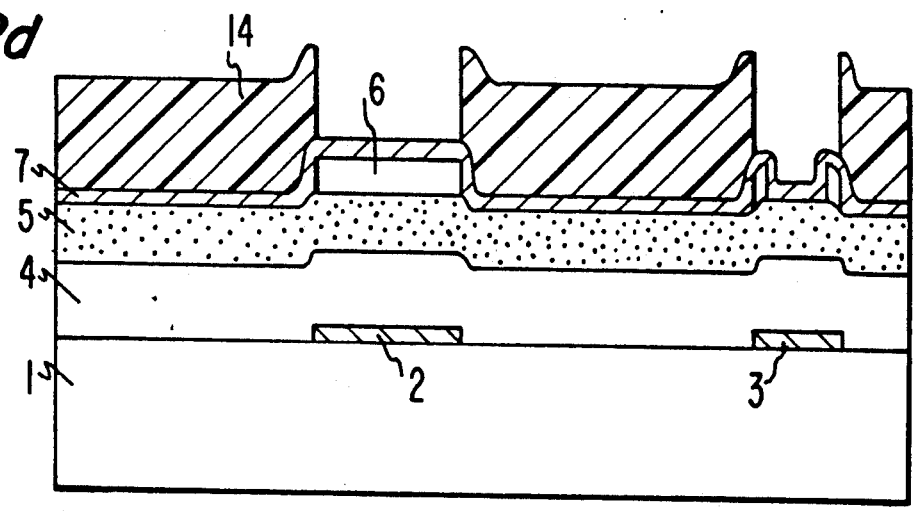

Forming the impurity-doped semiconductor layer 7, on the product obtained by performing step 2 by plasma CVD, coating the layer 7 with a negative resist film 14, exposing the resist film 14 to light radiating from the lower side (substrate 1 end) by using the gate electrode 2 and the gate terminal 3 as a photomask, and developing the resist film 14, thereby obtaining a pattern of the resist film 14 as shown in FIG. 2d in which the removed portions of the resist film 14 had exactly coincided with and had overlied the gate electrode 2 and the gate terminal 3. Thereafter, the portions of the imupurity-doped semiconductor layer 7 aligned with the gate electrode 2 ad the gate terminal 3 are etched by using the patterned resist film 14 as a mask, which is thereafter removed.

Step 4

Figure 2E:
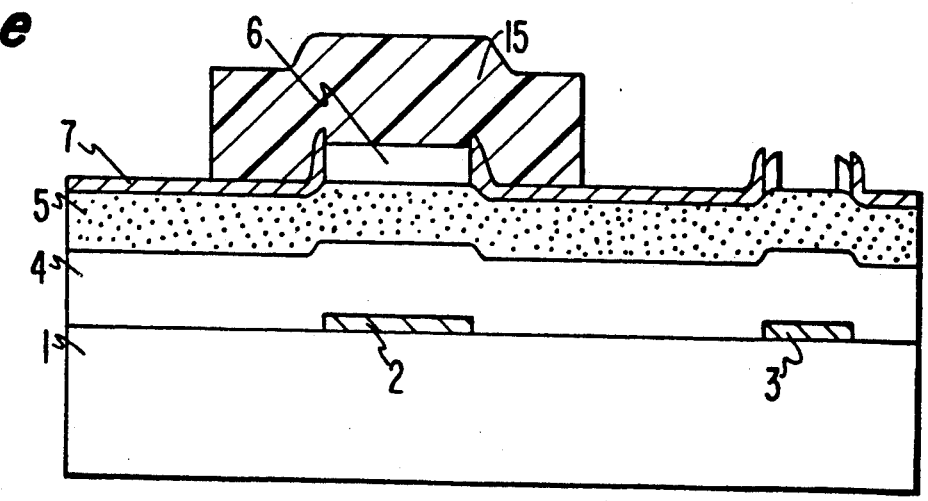

Coating the product obtained by performing step 4 with a positive resist film 15, patterning the resist film 15 into a specified pattern by using a photomask as shown in FIG. 2e, and thereafter etching the impurity-doped semiconductor layer 7 and the semiconductor layer 5 by using the patterned resist film 15 as a mask as shown in FIG. 2f.

Step 5

Etching the gate insulating layer 4 at the portion on the gate terminal 3 to obtain a window through which the gate terminal is exposed as shown in FIG. 2g.

Step 6

Forming the barrier metal layer 8 and the metal layer for the source and drain electrodes 9a and 9b, on the product obtained by performing step 5, by sputtering, and patterning the formed layers into the patterns of the source and drain electrodes 9a and 9b, thereby obtaining the TFT array as shown in FIG. 1.

As described above, the protective insulating layer 6 and the impurity-doped semiconductor layer 7 are patterned by the self-alignment method using the gate electrode 2 as the photomask.

Figure 3:
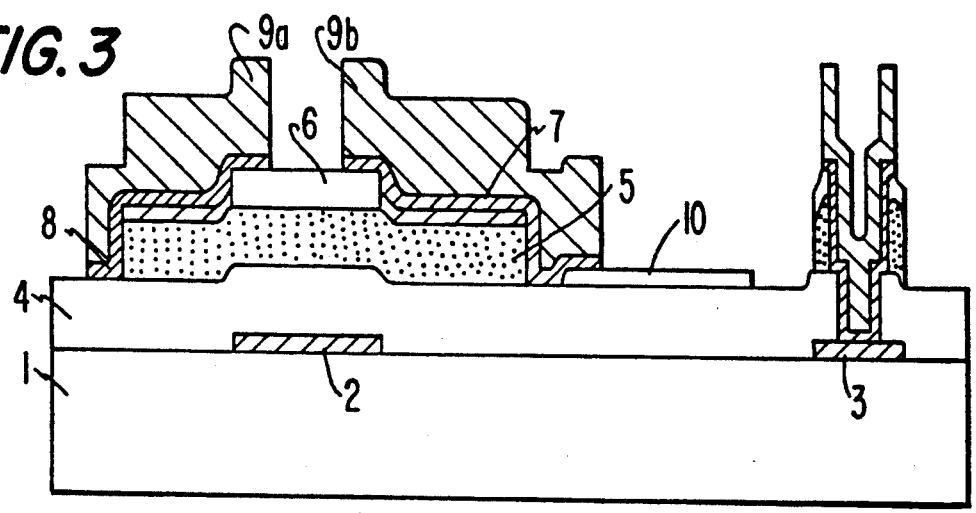
FIGS. 3, 4 and 5 are partial sectional views showing embodiments of self-aligned TFT arrays each having a pixel electrode according to the present invention.
Figure 4:
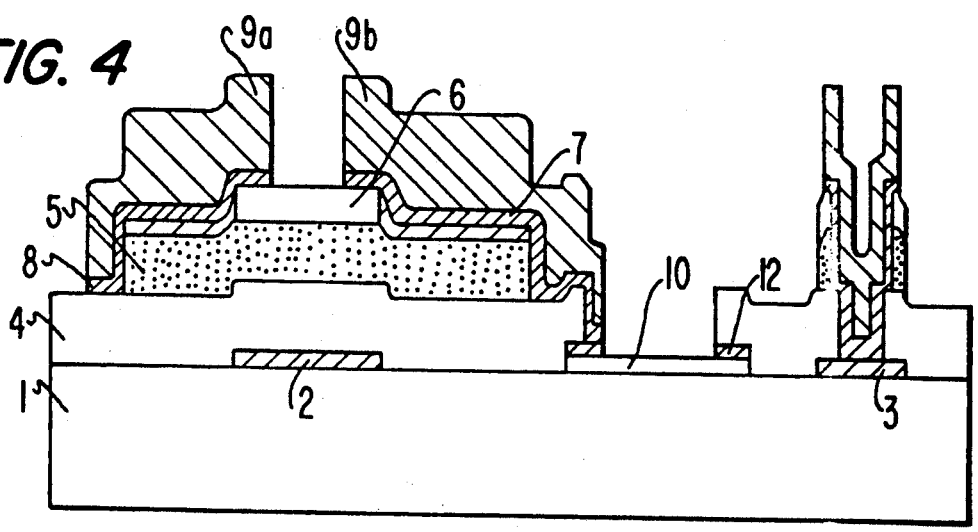
Figure 5:
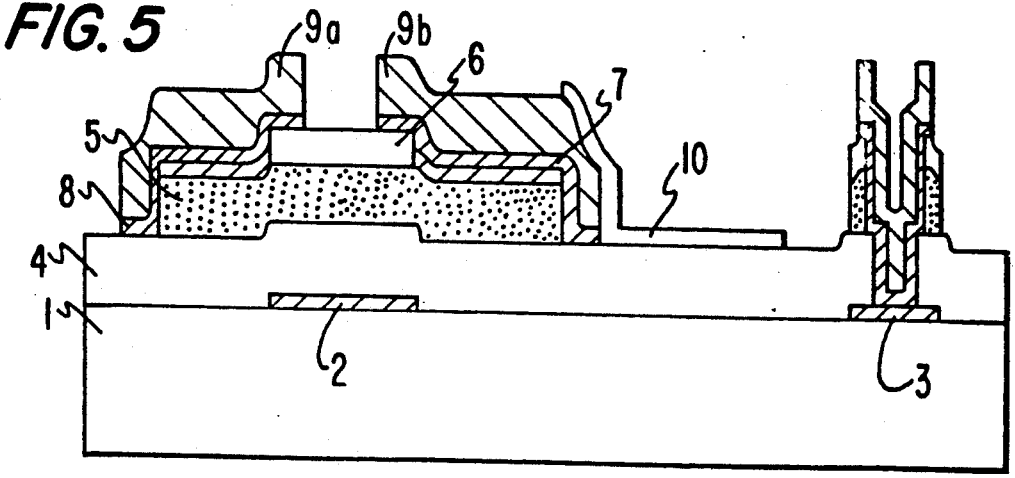

To use the TFT array in FIG. 1 as a TFT array for driving a LCD device, a transparent pixel electrode connected to the drain electrode must be provided as shown in FIGS. 3 to 5.

Referring to FIG. 3, a transparent pixel electrode 10 is formed on the gate insulating layer 4. The electrode 10 may be formed between the above described steps 4 and 5 or between the above described steps 5 and 6.

Referring to FIG. 4, the transparent pixel electrode 10 is formed on the transparent insulating substrate 1. The electrode 10 may be formed before the above described step 1, when a protective metal film 12 is formed on the electrode 10 for protecting the electrode 10 during the subsequent process. The protective metal film 12 is removed after forming the source and drain electrodes 9a and 9b.

Referring to FIG. 5, the transparent pixel electrode 10 is formed partly on the gate insulating layer and partly on the drain electrode 9b after the source and drain electrodes 9a and 9b have been formed.

Figure 6:
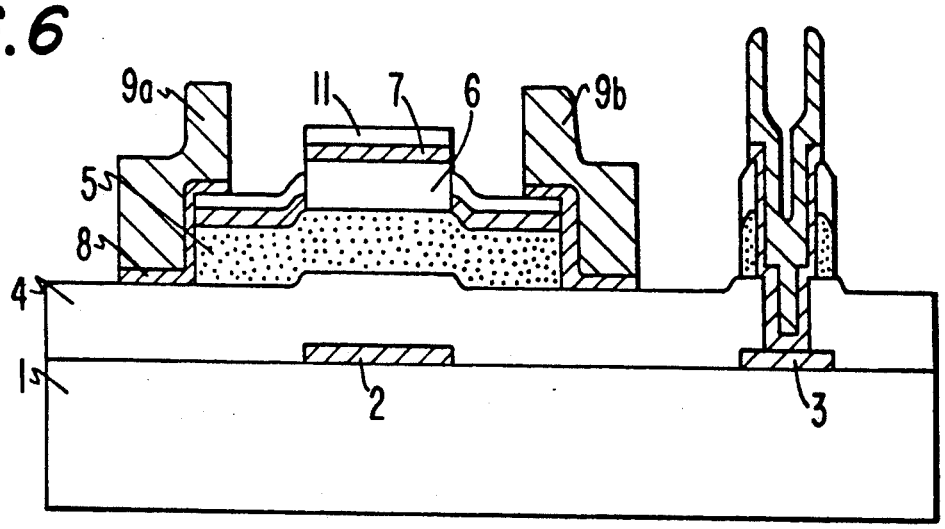
FIG. 6 is a partial sectional view showing another embodiment of a self-aligned TFT array according to the present invention.

FIG. 6 shows another embodiment of TFT array according to the invention. The protective insulating layer 6 formed on the semiconductor layer 5 is aligned with the gate electrode 2. The impurity-doped semiconductor layer 17 is formed on the semiconductor layer 5 and the protective insulating layer 6, and a third metal layer 11 is formed on the impurity-doped semiconductor layer 7. The portions of the impurity-doped semicondutor layer 7 and the third metal layer 11 on the protective insulating layer 6 are insolated from the portions of the layers 7 and 11 on the semiconductor layer 5 due to the level difference between the upper surfaces of the layers 7 and 5 so as not to form a parasitic capacitance. The third metal layer 11 may be made of chromium (Cr) and is used as a mask for patterning the semiconductor layer 5 and the impurity-doped semiconductor layer 7. The third metal layer 11 also provides the effect of preventing the TFT channel portion from being subjected to external light. The source and drain electrodes 9a and 9b are disposed so as not to cover the area above the TFT channel portion.

The TFT array in FIG. 6 can be manufactured by the following manufacturing process:

Steps 1, 2

Same as steps 1, 2 for the TFT array in FIG. 1.

Step 3

Figure 7A:
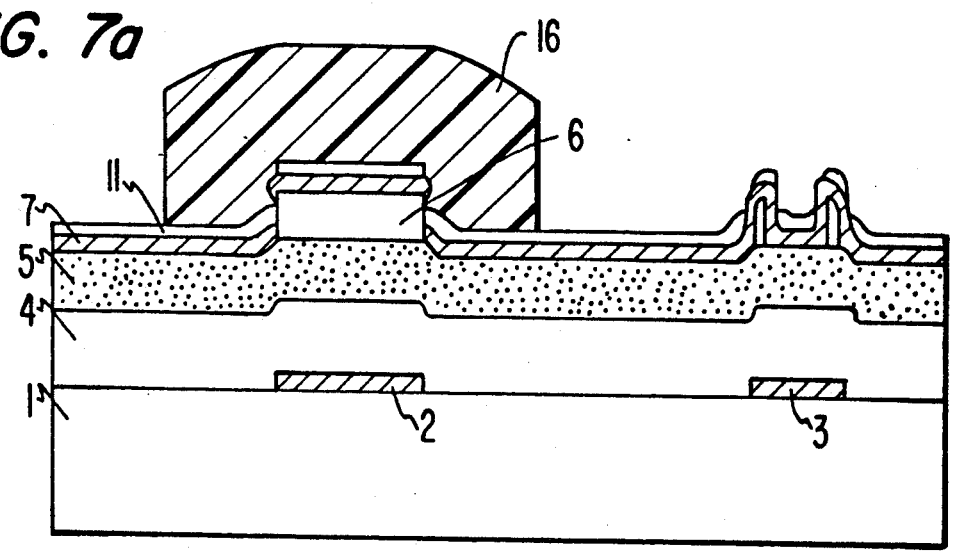

Forming the impurity-doped semiconductor layer 7 on the product formed by step 2 (FIG. 2c), and forming the third metal layer 11 on the impurity-doped semiconductor layer 7 by plasma CVD. At this time, the metal layer 11 is formed so as not to cover all of the side surfaces of the patterned protective insulating layer 6. Thereafter, a resist film 16 is formed on the metal layer 11 and is patterned into a specific pattern as shown in FIG. 7a.

Step 4

Figure 7B:
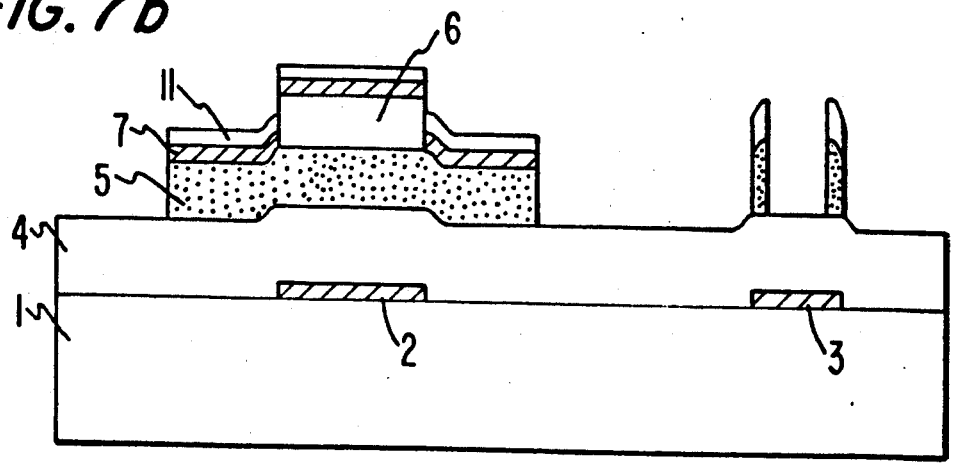

Patterning the metal layer 11 into the specific pattern by using the resist film 16 as a mask, and etching the impurity-doped semiconductor layer 7 and the semiconductor layer 5 into the specific pattern by using the metal layer 11 as a mask as shown in FIG. 7b.

Step 5

Removing the gate insulating layer 4 at the portion on the gate terminal 3 as shown in FIG. 7c.

Step 6

Forming the barrier metal layer 8 on the product obtained by step 5, forming the source and drain metal layer on the barrier metal layer 8, and patterning the formed layers into a specific pattern to form the source and drain electrodes 9a and 9b as shown in FIG. 6.

In the structure shown in FIG. 6, the TFT channel portion is prevented from being subjected to external light by the gate electrode 2 and the third metal layer 11.

To use the TFT array in FIG. 1 as a TFT array for driving a LCD device, a transparent pixel eiectrode must be provided as shown in FIGS. 8 TO 10. The structures shown in FIGS. 8 to 10 regarding the transparent pixel electrode 10 correspond to those shown in FIGS. 3 to 5, and therefore explanation thereof is omitted.

What is claimed is:

1. A method of manufacturing a thin film transistor array comprising the steps of:

forming a semiconductor layer and a protective insulating layer in turn on a gate insulating layer formed on a transparent insulating substrate and a gate electrode on said transparent insulating substrate;

forming a positive resist film on said protective insulating layer;

patterning said positive resist film by a self-alignment method using said gate electrode as a photomask into a pattern aligned with said gate electrode;

patterning said protective insulating layer by using said patterned resist film as a mask into a pattern aligned with said gate electrode;

forming an impurity-doped semiconductor layer on said semiconductor layer and said patterned protective insulating layer;

forming a metal layer on said impurity-doped semiconductor layer;

patterning said metal layer into a specific pattern covering a portion including a channel portion above said gate electrode;

patterning said impurity-doped semiconductor layer and said semiconductor layer by using said patterned metal layer as a mask;

forming source and drain electrodes on said gate insulating layer and a part of said metal layer not including a portion above said protective insulating layer.

2. The method according to claim 1, further comprising a step of forming a transparent pixel electrode on said gate insulating layer before the step of forming said source and drain electrodes.

3. The method according to claim 1, further comprising a step of forming a transparent pixel electrode on said transparent insulating substrate before forming said gate insulating layer.

4. The method according to claim 1, further comprising a step of forming a transparent pixel electrode on said gate insulating layer and said drain electrode after the step of forming said source and drain electrodes.

* * * * *